(12) United States Patent
Ishizaki

(10) Patent No.: US 7,157,307 B2
(45) Date of Patent: Jan. 2, 2007

(54) ZN-BASE SEMICONDUCTOR LIGHT-EMITTING DEVICE AND METHOD FOR MANUFACTURING SAME

(75) Inventor: Jun-ya Ishizaki, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 202 days.

(21) Appl. No.: 10/500,703

(22) PCT Filed: Oct. 30, 2003

(86) PCT No.: PCT/JP03/13910

§ 371 (c)(1), (2), (4) Date: Jul. 6, 2004

(87) PCT Pub. No.: WO2004/040662

PCT Pub. Date: May 13, 2004

(65) Prior Publication Data

US 2005/0017261 A1 Jan. 27, 2005

(30) Foreign Application Priority Data

Oct. 31, 2002 (JP) .............................. 2002-317354

(51) Int. Cl.
H01L 21/00 (2006.01)

(52) U.S. Cl. .................. 438/104; 257/43; 257/E33.064

(58) Field of Classification Search ..................... None
See application file for complete search history.

(56) References Cited

U.S. PATENT DOCUMENTS 6,664,565 B1 * 12/2003 Sano et al.

FOREIGN PATENT DOCUMENTS

| JP | 54-162688 | 12/1979 |
|---|---|---|
| JP | 07-058360 | * 3/1995 |
| JP | 8-264899 | 10/1996 |
| JP | 9-172199 | 6/1997 |
| JP | 2000-244014 | 9/2000 |
| JP | 2001-68485 | 3/2001 |
| JP | 2001-168392 | 6/2001 |

* cited by examiner

Primary Examiner—Nathan J. Flynn
Assistant Examiner—Kevin Quinto
(74) Attorney, Agent, or Firm—Snider & Associates; Ronald R. Snider (57) ABSTRACT

On the surface of a substrate 1, a precursory buffer layer 2' composed of an In-base compound or a Zn-base compound, not contained in the substrate 1, is formed so as to be stacked thereon as a polycrystal layer or an amorphous layer. Before a light emitting region is formed, the precursory buffer layer 2' is annealed for re-crystallization to thereby convert it into a buffer layer 2. This successfully provides a Zn-base semiconductor light emitting device which can readily be fabricated and capable of improving quality of the light emitting region, and a method of fabricating the same.

26 Claims, 4 Drawing Sheets

ZN-BASE SEMICONDUCTOR LIGHT-EMITTING DEVICE AND METHOD FOR MANUFACTURING SAME

TECHNICAL FIELD

This invention relates to a Zn-base semiconductor light emitting device and a method of fabricating the same.

BACKGROUND ART

ZnO (zinc oxide) is a direct-transition-type semiconductor having a band gap energy of 3.4 eV. A Zn-base semiconductor composed of ZnO or having ZnO as a base material is therefore a promising material for light emitting device capable of emitting light in blue to ultra-violet regions. The Zn-base semiconductor light emitting device is, however, fabricated by allowing a light emitting region composed of Zn-base semiconductor to epitaxially grow on the surface of a different kind of substrate such as a sapphire substrate, due to difficulty in obtaining a Zn-base semiconductor single crystal substrate having a desirable quality at low cost, unlike the case of a light emitting device using GaAs-base semiconductor or the like. For this reason, various efforts have been made on improvement in crystallinity of a buffer layer formed between the substrate and the light emitting region, in order to ensure desirable crystallinity of the light emitting region which affects emission characteristics such as emission efficiency, half value width of emission wavelength and so forth.

One example of the Zn-base semiconductor light emitting device intended for improving the crystallinity of the buffer layer is disclosed in Japanese Laid-Open Patent Publication No. 2001-68485, in which a single crystal stack, later converted into a buffer layer, is formed on a sapphire substrate at a temperature lower than the formation temperature of the light emitting region, and the stack is then annealed at a temperature almost equivalent to the formation temperature of the light emitting region, to thereby planarize the surface thereof and make it into the buffer layer.

It is, however, strongly demanded for the formation of the stack, later converted into the buffer layer, in a form of a single crystal layer under the low-temperature condition lower than the formation temperature of the light emitting region as described in the aforementioned Japanese Laid-Open Patent Publication No. 2001-68485, that the conditions such as formation temperature and length of time with respect to the formation must precisely be controlled. It is further necessary to adjust frequency band used for generating radicals when the stack is formed using an RS-MBE (Radical Source Molecular Beam Epitaxy) apparatus as disclosed again in Japanese Laid-Open Patent Publication No. 2001-68485. As is known from the above, formation of the stack to be converted into the buffer layer in a form of single crystal layer requires a high level of accuracy in the process control and causes increase in the cost. First of all, one of essential advantages of the Zn-base semiconductor including ZnO in the industrial application resides in its inexpensiveness as compared with other blue-light-emitting InGaN-base semiconductor or the like. Also from this point of view, it is important subject to fabricate the Zn-base semiconductor at a cost as low as possible.

This invention is conceived taking the above-described subjects into consideration, and an object thereof resides in providing a Zn-base semiconductor light emitting device which can readily be fabricated and capable of improving quality of the light emitting region, and a method of fabricating the same.

DISCLOSURE OF THE INVENTION

A first method of fabricating a Zn-base semiconductor light emitting device of this invention for solving the above-described subject is such as comprising the steps of:

forming, on a main surface of a substrate, a buffer layer composed of an In-base compound or a Zn-base compound not contained in the substrate; and forming, on the buffer layer, a light emitting region composed of a Zn-base compound, wherein the buffer layer is obtained by forming a stack as a polycrystal layer or an amorphous layer on the main surface of the substrate, and by annealing the stack before the light emitting region is formed.

This invention is targeted at the Zn-base semiconductor light emitting device having the light emitting region composed of the Zn-base compound. It is also aimed at improving crystallinity of the light emitting region through making an inventive effort on the formation process of the buffer layer to be disposed between the substrate and light emitting region. An essential feature of the first fabrication method to be emphasized in this invention is that the stack is first formed as a polycrystal layer or an amorphous layer, composed of an In-base compound or a Zn-base compound not contained in the substrate, on the main surface of the substrate (the stack is also referred to as a precursory buffer layer, hereinafter), and the precursory buffer layer is then annealed to convert it into the buffer layer before the light emitting region is formed. Formation of the precursory buffer layer as a polycrystal or an amorphous layer makes it possible to form a buffer layer, more readily as compared with the case where it is formed as a single-crystal layer. Formation of the precursory buffer layer first as a polycrystal layer or amorphous layer is successful in suppressing misfit dislocation ascribable to difference in the lattice constants with the substrate which may otherwise be anticipated when it is formed as a single crystal layer, or threading dislocation which possibly grows along the thickness-wise direction from occurring in an excessively concentrated manner along a certain specific orientation plane. The precursory buffer layer is then subjected to the annealing for re-crystallization. Temperature and length of time of the annealing are appropriately set depending on components of the precursory buffer layer so as to at least allow the re-crystallization to proceed. The precursory buffer layer is thus converted into the buffer layer while being subjected to the annealing for re-crystallization. During the re-crystallization, a layer portion in the vicinity of the main surface on the substrate side of the precursory buffer layer undergoes the re-crystallization while keeping matching with the lattice constants ascribable to crystal structure of the main surface of the substrate, and also the layer portion in the vicinity of the main surface of the precursory buffer layer, on the side opposite to the substrate side, undergoes the re-crystallization so as to keep matching of the lattice constants with those of its underlying layer. This is successful in improving the degree of orientation, and expectedly reducing, in the process of re-crystallization by annealing, any defects such as void defect or the aforementioned dislocation in the precursory buffer layer even if they should accidentally be incorporated into the precursory buffer layer. As for the dislocation, this intrinsically occurs in a random direction even it should accidentally be incorporated into the precursory buffer layer, so that it is expectable that the re-crystallization can proceed in the process of the annealing so as to relax the stress ascribable to the dislocation. It is thus made possible to readily form the high-quality buffer layer, and further to improve quality of the light emitting region formed thereon. The annealing carried out herein also results in improvement in the planarity of the main surface of the buffer layer on the side opposite to the substrate side, although it is essentially aimed at re-crystallization.

Specific examples of the aforementioned Zn-base compound possibly composing the buffer layer include those having ZnO and ZnO as a base material wherein a part of the Zn (zinc) sites of which being substituted by Mg (magnesium) and so forth, and those having a part of the O (oxygen) sites of ZnO substituted by S (sulfur), Se (selenium), Te (tellurium) and so forth. Among them, ZnO is particularly preferable because it is anticipated that the alloy system may cause an excessive compositional fluctuation. On the other hand, specific examples of the In-base compound for composing the buffer layer include publicly-known, indium-base oxides and tin-added ITO (indium tin oxide), and among these, ITO is a preferable material because it is highly conductive as being characterized by an electric conductivity (normal temperature) of as large as $10^{-4}$ $\Omega$cm or around, and is transparent in the visible light region. ITO is advantageous also in that it has an intermediate lattice constant between those of sapphire substrate, for example, and ZnO, so that use of a sapphire substrate as the substrate and ITO as a constitutive material for the buffer layer is expectant of moderating difference in the lattice constants between the substrate and a layer for composing the light emitting region.

The precursory buffer layer is formed as a polycrystal layer or an amorphous layer. Next paragraphs will describe essential features of this invention in relation to the case where the buffer layer is formed as a polycrystal layer. That is, the first fabrication method of this invention is characterized in that the substrate is a single-crystal substrate, and that the stack is formed as a polycrystal layer composed of crystal grains oriented in the direction of the principal axis of the single-crystal substrate.

By using a single-crystal substrate as the substrate, the precursory buffer layer can readily be formed as a polycrystal layer in the formation process thereof, in which the crystal grains are oriented in the direction of the principal axis (thickness-wise direction) of the single-crystal substrate rather than in the in-plane direction. It is therefore particularly preferable that the precursory buffer layer is formed as a polycrystal layer having the crystal grains oriented in the thickness-wise direction. If the precursory buffer layer is formed as the polycrystal layer as described in the above, it is all enough, in the annealing for converting the precursory buffer layer into the buffer layer, to raise the degree of orientation only in the in-plane direction. This consequently facilitates the formation of the buffer layer having an improved quality. The above-described misfit dislocation and threading dislocation tend to occur basically depending on difference between the lattice constant in the in-plane direction of the main surface of the substrate and the lattice constant in the in-plane direction of a material composing the precursory buffer layer, so that the formation of the polycrystal layer composed of crystal grains oriented in the thickness-wise direction still makes it possible to suppress the generation of dislocation or defect more effectively than the formation of a single-crystal layer can do.

It is still also preferable to form the stack, later becoming the buffer layer, so that columnar crystal grains spanned from the main surface of the substrate to the topmost surface of the stack are densely arranged on the main surface of the substrate. The precursory buffer layer thus configured so that columnar crystal individually oriented in the thickness-wise direction are densely arranged on the main surface of the substrate is equivalent to a form in which the columnar crystal grains are separately formed in a dot-wise manner so as to be densely arranged on the main surface of the substrate. It is, however, to be understood that there may be a void between every adjacent columnar crystal grains at least in a partial section (entire section also included) in the thickness-wise direction. The void herein means that typically configured by the air, or by any crystal grains having a grain size smaller than that of the columnar crystal grain. By forming the precursory buffer layer as the polycrystal layer, it is made possible to effectively suppress growth of the individual columnar crystal grains in the in-plane direction in the process of selective growth in the thickness-wise direction. This makes it possible to more effectively suppress generation and growth of the dislocation and defect. The dense arrangement of the columnar crystal grains also makes it possible to readily re-crystallize the precursory buffer layer through annealing while using the columnar crystal grains as seed crystals, and to obtain a high-quality buffer layer.

The precursory buffer layer is preferably formed as having the columnar crystal grains densely arranged on the main surface of the substrate as described in the above, and it is particularly preferable to form the columnar crystal grains so that the one and at least the adjacent one are formed while keeping a void therebetween, on the topmost surface of the stack (on the side opposite to the substrate side). The precursory buffer layer is required to have an excellent crystallinity while the dislocation, crystal defect and so forth being successfully suppressed therein, because the topmost surface on the side opposite to the substrate side thereof will be disposed closest to a layer which will later be the light emitting region. By arranging the columnar crystal grains densely on the topmost surface of the precursory buffer layer opposite to the substrate side so that the one and at least the adjacent one are formed while keeping a void therebetween, growth of the dislocation and crystal defects are effectively prevented from reaching the topmost surface of the precursory buffer layer opposite to the substrate side. This consequently makes it possible to improve crystallinity of the topmost surface of the buffer layer opposite to the substrate side, and to further raise quality of the light emitting region. It is to be understood that the columnar crystal grain described herein means a grain having an average grain size on the layer plane of approximately 5 nm to 500 nm, and the state of dense arrangement of the columnar crystal grains means a state having an in-plane surface coverage ratio by the columnar crystal grains of approximately 50% to 99%.

The preceding paragraphs described a case where the precursory buffer layer is formed as a polycrystal layer. The next paragraphs will describe a case where the precursory buffer layer is formed as an amorphous layer. That is, the case is characterized in that, in the first fabrication method of this invention, the substrate is a single-crystal substrate, the stack later becoming the precursory buffer layer is formed as an amorphous layer, and the stack is annealed to convert itself into the polycrystal buffer layer.

First, the precursory buffer layer formed on the main surface of the single-crystal substrate is formed as an amorphous layer. The formation in a form of amorphous layer herein makes it possible to prevent the misfit dislocation ascribable to difference in the lattice constant with the substrate, or threading dislocation growing in the thickness-wise direction, from generating along a specific orientation plane, in a more effective manner as compared with the formation in a form of polycrystal layer. Use of the single-crystal substrate also during the re-crystallization of the precursory buffer layer by annealing also makes it possible to readily convert it into the polycrystal buffer layer, because the re-crystallization can proceed in a ready-to-orient manner. This consequently makes it possible to obtain the buffer layer having an excellent crystallinity, in which generation and growth of the dislocation and defect are effectively suppressed. In the re-crystallization of the precursory buffer layer composed of an amorphous layer so as to obtain the polycrystal layer, use of a single-crystal substrate also makes it possible to readily produce a polycrystal layer having a thickness-wise orientation, similarly to as described in the above. In other words, even when the precursory buffer layer is formed as an amorphous layer in order to further suppress the generation of dislocation or crystal defect, the precursory buffer layer can be re-crystallized into a polycrystal layer in a crystal state having the degree of orientation as described in the above, by appropriately making correspondence between annealing conditions for the re-crystallization towards polycrystal with formation conditions such as formation temperature and length of time according to which the aforementioned precursory buffer layer is formed as a polycrystal layer.

Formation of the precursory buffer layer as a polycrystal layer or an amorphous layer as described in the above makes it possible to readily form a high-quality buffer layer, more effectively as compared with the case where it is formed as a single-crystal layer. More specifically, the formation temperature set to at least 400° C. or below makes it possible to form the precursory buffer layer as a polycrystal layer or an amorphous layer. The formation temperature of the precursory buffer layer exceeding 400° C. may fail in fully suppressing the generation of dislocation or crystal defect due to enhanced in-plane orientation, or accelerated trend in forming single crystal. The lower limit of the formation temperature may be set to normal temperature. Within the range of thus-set formation temperature of the precursory buffer layer, the crystallization state can be regulated from amorphous to polycrystal as the set temperature becomes higher. The formation temperature set within a range from the normal temperature to 350° C. or around results in the amorphous layer, and the formation temperature exceeding the above range results in the polycrystal layer, depending on materials composing the precursory buffer layer.

In order to convert the stack in a form of the polycrystal layer or amorphous layer into the buffer layer, temperature of the annealing effected on the precursory buffer layer is preferably set higher than the formation temperature of the stack, that is the precursory buffer layer. The annealing effected on the precursory buffer layer is intended for obtaining a crystal state having an enhanced orientation through re-crystallization. The larger heat energy given in the annealing for the re-crystallization is the better, wherein the heat energy can be increased by raising the annealing temperature, elongating the annealing time, and so forth. The elongation of the annealing time will, however, result in lowering in the operational efficiency. Setting of the annealing temperature higher than at least the formation temperature of the precursory buffer layer is, therefore, successful in efficiently allowing the re-crystallization of the precursory buffer layer to proceed without setting an excessively long annealing time. This mode of setting of the annealing temperature can successfully yield the buffer layer improved at least in the degree of orientation as compared with that of the precursory buffer layer. This is because the buffer layer will gain a higher level of orientation such as changing from amorphous to polycrystal, as the heat energy for the re-crystallization increases.

The above-described temperature of the annealing effected on the precursory buffer layer is, of course, more preferable if it is set higher as possible than the formation temperature of the precursory buffer layer, and is particularly preferable if it is set higher than the formation temperature of the light emitting region. Because the light emitting region is, of course, required to have an excellent crystallinity, such as being more closer to single crystal (including single crystal), the formation temperature therefor is more preferable if it is set higher than the formation temperature of the precursory buffer layer. The formation temperature of the light emitting region in this case is preferably adjusted within a range from 300 to 1,000° C., for example, although depending on materials for composing the light emitting region. By setting the temperature of the annealing effected on the precursory buffer layer higher than at least the formation temperature of the light emitting region, it is made possible to obtain the buffer layer having a crystallinity more closer to a desired one for the light emitting region. Although the upper limit of the annealing temperature effected on the precursory buffer layer is not specifically limited, an excessively high temperature may result in increase in the production cost, so that a temperature at around 1,100° C., for example, will suffice.

Next, the substrate to be used can specifically be exemplified by aluminum oxide, gallium oxide, magnesium oxide, aluminum nitride, gallium nitride, silicon, silicon carbide, gallium arsenide and glass. Among these, a sapphire substrate such as being a single-crystal aluminum oxide substrate is said to be particularly preferable for this invention, if the crystal structure of Zn-base compound for composing the light emitting region (e.g., wurtzite crystal structure represented by ZnO) and lattice constants thereof are taken into consideration. Use of the sapphire substrate as described in the above is effective for improving the crystal matching property with the Zn-base compound composing the light emitting region. On the other hand, a glass substrate is preferably selected in view of further lowering the production cost.

The annealing for re-crystallization to be effected on the precursory buffer layer in this invention will be discussed in the next. In particular, the annealing atmosphere in the annealing is preferably an oxygen-containing atmosphere. As has been described in the above that the precursory buffer layer is particularly preferable if it is composed of indium tin oxide or zinc oxide, the precursory buffer layer is basically composed of a composition containing oxygen. The annealing atmosphere in the annealing is, therefore, preferably an oxygen-containing atmosphere in order to suppress elimination of the oxygen component during the annealing, and to sufficiently fill the predetermined oxygen sites in the crystal without causing deficiency. This consequently results in further improvement in the crystallinity of the buffer layer.

The thickness of the formation of the buffer layer in this invention will be discussed in the next. In particular, the thickness of the buffer layer is preferably adjusted to 1 µm or below. The buffer layer herein is obtained by annealing for re-crystallization of the precursory buffer layer, wherein the thickness of the buffer layer exceeding 1 µm may result in difficulty in inducing the re-crystallization for raising the degree of orientation, or may result in need of an excessively high annealing temperature or longer annealing time. It is therefore particularly preferable to adjust the thickness of the buffer layer to at least 1 µm or below. Although the lower limit of the thickness of the buffer layer is not specifically limited, an excessively small thickness may fail in exhibiting a function of the buffer layer, which is relaxation of lattice mismatching ascribable to difference in the compositional materials between the substrate and light emitting region, so that the thickness is preferably set to 5 nm or above.

Next, a second method of fabricating a Zn-base semiconductor light emitting device of this invention is such as forming, on a main surface of a substrate, a buffer layer composed of an In-base compound or a Zn-base compound not contained in the substrate; and forming, on the buffer layer, a light emitting region composed of a Zn-base compound, wherein the buffer layer is obtained by forming a stack composed of the In-base compound or the Zn-base compound at the temperature lower than the formation temperature of the light emitting region, and by annealing, before the light emitting region is formed, the stack at a temperature higher than the formation temperature of the light emitting region.

Similarly to the first fabrication method described in the above, the second fabrication of this invention forms the stack, that is the precursory buffer layer, composed of the In-base compound or Zn-base compound, and anneals the precursory buffer layer for re-crystallization to thereby convert it into the buffer layer. This should, however, be on the premise that the formation temperature of the precursory buffer layer is set lower than the formation temperature of the light emitting region, and that the temperature of the annealing to be effected on the precursory buffer layer is set higher than the formation temperature of the light emitting region. By setting the formation temperature of the precursory buffer layer lower than the formation temperature of the light emitting region as described in the above, it is made possible to readily form the precursory buffer layer in a form of a polycrystal layer, or an amorphous layer, or a crystal state containing these two phases, having the degree of orientation lower than that of a single crystal layer. The formation temperature of the precursory buffer layer set lower than the formation temperature of the light emitting region only simply arises from an expectation of effectively suppressing excessive generation of dislocation or crystal defect which is anticipated when the precursory buffer layer is formed as a single-crystal layer. This is therefore by no means intended for forming a single-crystal layer typically by using a publicly-known RS-MBE apparatus under a lowered formation temperature while making use of characteristics of free radicals such as oxygen radical. By re-crystallizing the precursory buffer layer at the annealing temperature set higher than the formation temperature of the light emitting region, it is made possible to readily obtain the buffer layer having a degree of orientation more closer to, or almost equivalent to the crystallinity (single-crystal state) required for the light emitting region. The annealing temperature of the annealing to be effected on the precursory buffer layer set higher than the formation temperature of the light emitting region also makes it possible to obtain a high-quality buffer layer without excessively elongating the annealing time in the annealing, and this effectively reduces the production cost.

The above-described second fabrication method of this invention is to make it possible to readily form the high-quality buffer layer by specifying the relation of highness of the formation temperature of the precursory buffer layer, annealing temperature of the annealing to be effected on the precursory buffer layer and the formation temperature of the light emitting layer portion, and is to make it possible to raise the quality of the light emitting region. Next paragraphs will describe a third fabrication method capable of ensuring similar effects.

The third method of fabricating a Zn-base semiconductor light emitting device of this invention is such as forming, on a main surface of a substrate, a buffer layer composed of an In-base compound or a Zn-base compound not contained in the substrate; and forming, on the buffer layer, a light emitting region composed of a Zn-base compound, wherein the buffer layer is obtained by forming a stack composed of the In-base compound or the Zn-base compound at a temperature lower than the formation temperature of the light emitting region, by annealing the stack at a first annealing temperature set between the formation temperature of the light emitting region and the formation temperature of the stack, and by further annealing, before the light emitting region is formed, the stack at a second annealing temperature set higher than the formation temperature of the light emitting region.

The third fabrication method of this invention is common with the above-described second fabrication method in that the precursory buffer layer is formed at a temperature lower than the formation temperature of the light emitting region. The third fabrication method, however, subjects the precursory buffer layer to two-step annealing for re-crystallization to thereby obtain the buffer layer. First, the precursory buffer layer is subjected to a first-step annealing at a first annealing temperature set between the formation temperature of the light emitting region and the formation temperature of the precursory buffer layer, and thereafter subjected to a second-step annealing at a second annealing temperature set higher than the formation temperature of the light emitting region. In this sort of two-step annealing of the precursory buffer layer, the re-crystallization is promoted in the first-step annealing while suppressing abrupt growth of the crystal grains, and this consequently makes it possible to effectively suppress any factors possibly disturbing the crystallinity, such as segregation in the grain boundary. The second-step annealing, effected on the crystal state having a preliminarily improved degree of orientation through the first-step annealing, is successful in obtaining a crystal state further improved in the degree of orientation. As has been described in the above, also the third fabrication method makes it possible to readily form the high-quality buffer layer similarly to the second fabrication method, and to improve quality of the light emitting region.

In the above-described third fabrication method, it is also made possible to further improve the crystallinity of the buffer layer by adopting the method of formation described in the next. More specifically, the buffer layer in the third fabrication method of this invention is characterized in that being formed by annealing the stack (the aforementioned precursory buffer layer), which corresponds to the first layer portion of the buffer layer, at the first annealing temperature, by stacking the In-base compound or the Zn-base compound on the stack to thereby form a second layer portion of the buffer layer, and by annealing at the second annealing temperature.

First, the stack for forming the precursory buffer layer is formed at a temperature lower than the formation temperature of the light emitting region. The precursory buffer layer forms the first layer portion composing the buffer layer. The precursory buffer layer is then subjected to the annealing at the first annealing temperature. The processes up to here are similar to those as described in the above. On the precursory buffer layer thus annealed at the first annealing temperature, the In-base compound or Zn-base compound is stacked to thereby form the second layer portion of the buffer layer. It is to be noted herein that the second layer portion is composed of the same compositional material with the first layer portion, and the formation temperature therefor is lower than the formation temperature of the light emitting region. Thus-formed second layer portion will have a crystal matching property between itself and the underlying first layer portion better than a crystal matching property between the first layer portion and the substrate, and will consequently have an excellent crystallinity, in which dislocation and crystal defect are further suppressed as compared with those in the first layer portion. The buffer layer is formed after the second layer portion is formed, and the second layer portion is annealed at the second annealing temperature. This consequently makes it possible to obtain the buffer layer having a further improved crystallinity.

The preceding paragraphs described the second and third fabrication methods of this invention, wherein it is particularly preferable to set the formation temperature of the light emitting region within a range from 300° C. to 1,000° C., both ends inclusive. Of course the light emitting region must have an excellent crystallinity with a high degree of orientation, and the formation temperature lower than 300° C. may sometimes fail in providing, in a form of heat energy, crystallization energy for fully raising the degree of orientation, even under a state where the crystallinity of the buffer layer is ensured at a satisfactory level. In this context, higher formation temperature is the better, but the temperature set to an excessively high level may result in increased production cost, and increased amount of vaporization for some compositional materials. The upper limit of the temperature is thus preferably set to 1,000° C. Taking these matters into consideration, the formation temperature of the light emitting region is preferably set to a range from 300° C. to 1,000° C., both ends inclusive.

In the second and third fabrication methods of this invention, specific examples of the compositional materials of the buffer layer, preferable materials therefor, preferable thickness of the buffer layer, preferable range for the formation temperature of the stack, that is the precursory buffer layer, and preferable annealing atmosphere for the annealing to be effected on the precursory buffer layer may be such as those described in the above in connection with the first fabrication method, and these can be adopted in a desirable manner. The explanation therefor will therefore be omitted.

Use of the above-described fabrication method of this invention makes it possible to readily improve the quality of the buffer layer, and to raise the quality of the light emitting region. This consequently improves the light emitting property of the resultant Zn-base semiconductor light emitting device. In other words, the Zn-base semiconductor light emitting device of this invention is characterized by comprising at least a buffer layer containing an In-base compound or a Zn-base compound not contained in the substrate, and a light emitting region composed of a Zn-base compound, wherein the buffer layer is a polycrystal layer or an amorphous layer obtained after crystallization. As is known from the above, the buffer layer of the Zn-base semiconductor light emitting device of this invention comprises a polycrystal layer or an amorphous layer after being crystallized. The polycrystal layer or the amorphous layer herein to be subjected to the crystallization corresponds to the above-described precursory buffer layer, and the crystallization corresponds to the annealing for the above-described re-crystallization. This consequently makes it possible to readily and effectively improve the quality of the buffer layer as described in the above.

BEST MODES FOR CARRYING OUT THE INVENTION

The following paragraphs will describe best modes for carrying out this invention referring to the attached drawings.

Figure 1:
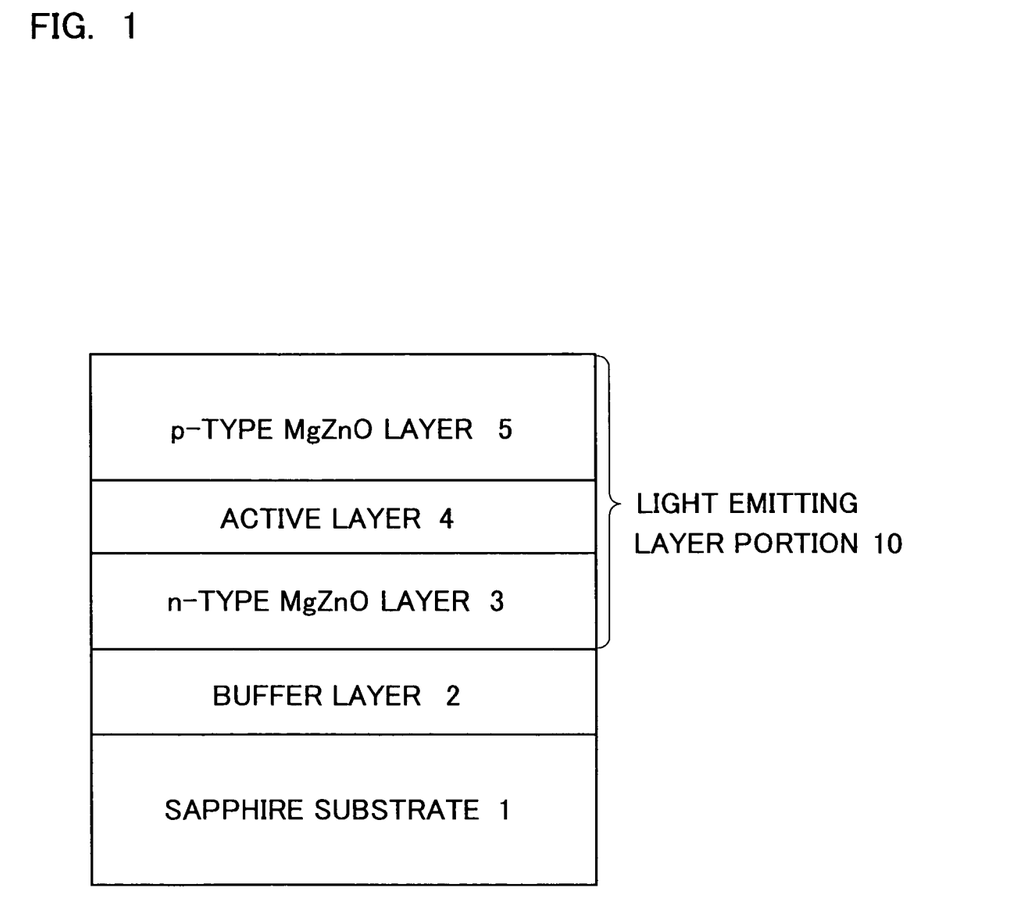
FIG. 1 is a schematic sectional view showing an essential portion of one embodiment of a Zn-base semiconductor light emitting device according to this invention.
Figure 2:
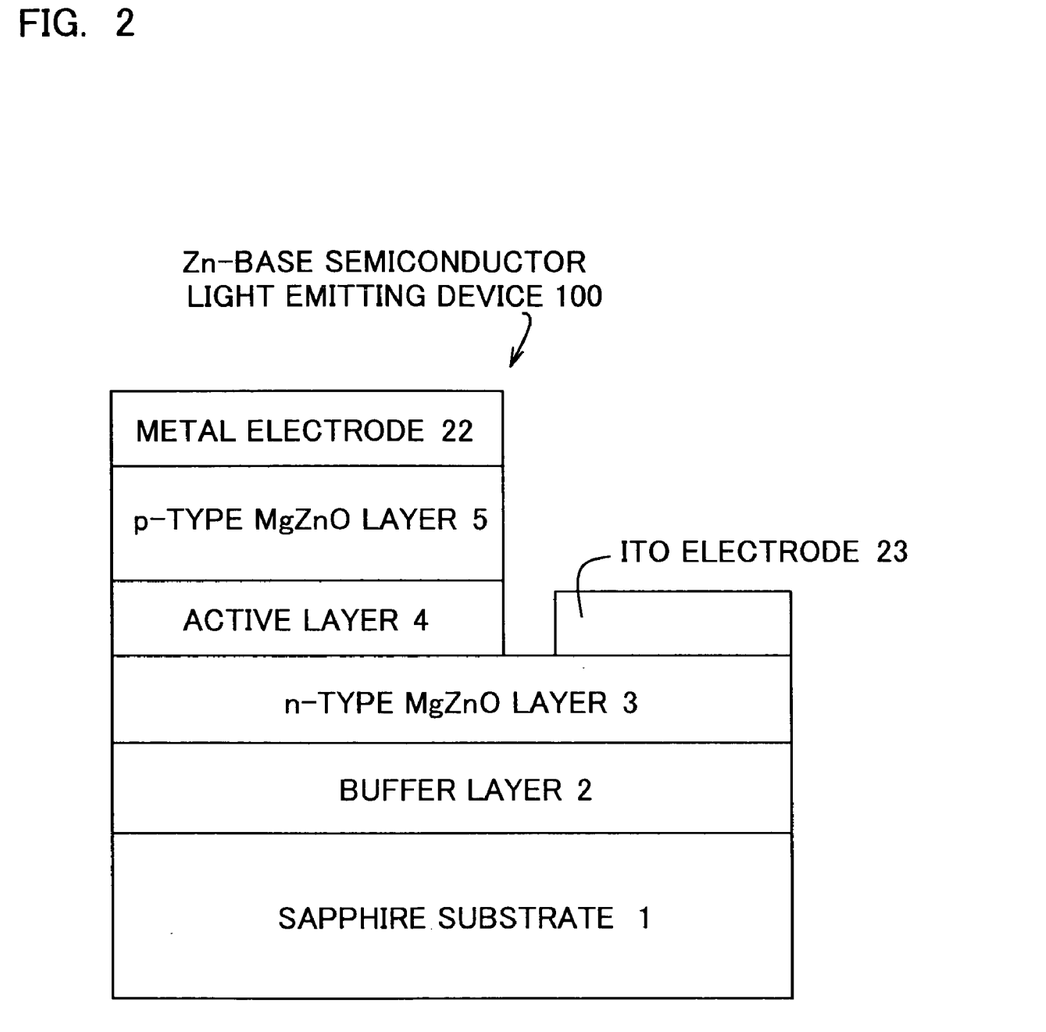
FIG. 2 is a schematic sectional view showing one embodiment of a Zn-base semiconductor light emitting device according to this invention.

FIG. 1 is a schematic sectional view showing a stack structure of an essential portion of the Zn-base semiconductor light emitting device according to one embodiment of this invention. As shown in FIG. 1, a buffer layer 2 composed of ZnO is formed on the main surface of a sapphire substrate 1. An n-type MgZnO layer 3 composed of $Mg_{1-a}Zn_aO$ ($0 \leq a \leq 1$) (also referred to as MgZnO), an active layer 4 composed of a Zn-base compound, and a p-type MgZnO layer 5 are stacked in a lattice-matched manner by the epitaxial growth process to thereby form a light emitting layer portion 10 which serves as a double-hetero-type light emitting region. A material composing the active layer 4 is properly selected, for example, from ZnO, and ZnO-base materials having a part of Zn sites thereof substituted by Mg, or having a part of O sites thereof substituted by S, Se, Te or the like depending on a desired emission wavelength. The buffer layer 2 is obtained by stacking of the precursory buffer layer in a form of a polycrystal layer or amorphous layer, and by subsequent annealing for crystallization before the light emitting layer portion 10 is formed. This way of formation of the buffer layer makes it possible to readily form the buffer layer having dislocation or defect successfully reduced and having an excellent crystallinity.

The individual layers except the buffer layer 2 shown in FIG. 1, and the precursory buffer layer to be converted into the buffer layer 2 can be grown by the epitaxial growth process such as MOVPE (Metal Organic Vapor Phase Epitaxy) process or MBE (Molecular Beam Epitaxy). It is to be noted that MBE described in this patent specification not only means MBE in a narrow sense using both of the metal element component source and non-metal element component source in a solid state, but conceptually includes MOMBE (Metal Organic Molecular Beam Epitaxy) using the metal element component in a form of organic metal and using the non-metal element component source in a solid state; gas source MBE using the metal element component source in a solid state and the non-metal element component source in a gas state; and chemical beam epitaxy (CBE) using the metal element component source in a form of organic metal and using the non-metal element component source in a gas form. As far as the precursory buffer layer, formed in advance of the crystallization in order to obtain the buffer layer 2, is concerned, it can be formed by methods other than the epitaxial growth process, such as sputtering process, DC-magnet-assisted sputtering and PLD (Pulsed Laser Deposition) process. The sputtering process is preferably adopted for the formation, in particular for the case where the buffer layer is composed typically using a material such as ITO, other than Zn-base compound such as ZnO. More specifically, the method of forming the precursory buffer layer can properly be selected from any publicly-known chemical vapor deposition process or physical vapor deposition process, while taking necessary formation temperature and length of time for the formation into consideration, because the crystal growth conditions such as crystal growth mode can vary depending on materials for composing the buffer layer. A most essential point is that the precursory buffer layer should be formed as an amorphous layer or polycrystal layer, which is lower in crystal continuity and periodicity as compared with those of single crystal layer.

As for the formation conditions for the precursory buffer layer, at least the formation temperature is preferably set to 400° C. or below. For example, the formation temperature is set within a range from normal temperature to 350° C. or around for the precursory buffer layer formed as the amorphous layer, and within a range from approximately 350° C. to 400° C. for that formed as the polycrystal layer. After the precursory buffer layer is thus formed, the layer is then subjected to the annealing for crystallization. It is particularly preferable to set a higher temperature for the annealing, because the annealing is intended for improving the degree of orientation through re-crystallization. For example, the annealing temperature is set higher at least than the formation temperature of the precursory buffer layer. The annealing temperature set higher makes it possible to shorten the process time. For example, the annealing is effected for 30 seconds or around under an annealing temperature of 1,100° C., and for 10 minutes or around under an annealing temperature of 800° C. The buffer layer can thus be improved in the degree of orientation by the annealing which is proceeded in a vapor phase epitaxy apparatus such as an MOVPE apparatus, or in a sputtering apparatus, while adjusting the annealing temperature within a range from 300 to 1,100° C., and the annealing time within a range from 30 seconds to 30 minutes. The atmosphere of this type of annealing to be effected on the precursory buffer layer is particularly preferable if it is provided as an oxygen-containing atmosphere (oxidative atmosphere). For example, creation of an oxidative atmosphere by using nitrous oxide or oxygen as an oxidative gas is successful in obtaining the buffer layer having oxygen deficiency effectively suppressed.

The buffer layer 2 shown in FIG. 1 is formed by subjecting the precursory buffer layer to the above-described annealing. The light emitting layer portion 10 is thereafter formed typically using an MOVPE apparatus at a formation temperature of 300 to 800° C. or around. The n-type MgZnO layer 2 shown in FIG. 1 contains one or more n-type dopants selected from B, Al, Ga and In. B, Al, Ga and In, which are the Group III elements, can substitute Mg or Zn, which are the Group II elements, and can dope n-type carriers. Considering the crystallinity of the n-type MgZnO layer 2, it is preferable to select Ga, having an ion radius close to that of Zn element, as an n-type dopant.

On the other hand, the p-type MgZnO layer 5 contains one or more p-type dopants selected from Li, Na, Cu, N, P, As, Al, Ga and In. Li and Na, which are the Group I elements, can substitute the sites of Mg or Zn which are the Group II elements; N, P and As, which are the Group V elements, can substitute the site of O, to thereby dope p-type carriers. CuO is a p-type semiconductor in the non-doped state, so that Cu can function as a p-type dopant when being doped to thereby produce CuO. Co-addition of Al, Ga, In or Li with N is successful in more exactly obtain a desirable p-type characteristic. Considering the crystallinity of the p-type MgZnO layer 5, it is preferable to select N having an ion radius close to that of Zn or O element, together with one or more selected from Ga, Al and In, particularly Ga.

For the case where the precursory buffer layer to be converted into the buffer layer 2, and the individual layers except this layer shown in FIG. 1 are formed in a vapor-phase epitaxy apparatus, major raw materials available for the individual layers include the followings:

Oxygen component source gas: preferably supplied in a form of an oxidative compound gas in view of suppressing excessive reaction with organo-metallic gases described later, although supply in a form of oxygen gas also allowable. Specific examples include $N_2O$, NO, $NO_2$ and CO. $N_2O$ (nitrous oxide) is used in this embodiment;

S source gas: $H_2S$, etc.;

Se source gas: $H_2Se$, etc.;

Te source gas: $H_2Te$, etc.;

Zn source (metal component source) gas: dimethyl zinc (DMZn), diethyl zinc (DEZn), etc.; and Mg source (metal component source) gas: biscyclopentadienyl magnesium ($Cp_2Mg$), etc.

As a p-type dopant, one or more elements selected from Al, Ga and In can be allowed to function as a desirable p-type dopant when added together with N. Examples of the available dopants include the followings:

Al source gas: trimethyl aluminum (TMAl), triethyl aluminum (TEAl), etc.;

Ga source gas: trimethyl gallium (TMGa), triethyl gallium (TEGa), etc.; and

In source gas: trimethyl indium (TMIn), triethyl indium (TEIn), etc.

For the case where the metal element (Ga) is used together with N as p-type dopants, a gas which serves as an N source (e.g., $NH_3$) when the p-type MgZnO layer is grown by vapor phase epitaxy is supplied together with an organo-metallic gas which serves as a Ga source. It is also allowable to make $N_2O$ used for an oxygen component source function also as an N source.

Addition of any one or more of Al, Ga and In as an n-type dopant makes it possible to dope an n-type carrier. Dopant gases available herein are such as those listed in the above.

MgZnO is highly causative of oxygen deficiency during vapor phase epitaxy in a vacuum environment, and tends to inevitably have an n-type conductivity. It is therefore also allowable to intentionally produce the oxygen deficiency in the growth of the n-type MgZnO layer 3 shown in FIG. 1, to thereby achieve n-type conductivity, and for this purpose it is effective to reduce pressure of the oxygen-containing atmosphere lower than that for growing the active layer 4 and p-type MgZnO layer 5 (e.g., lower than $1 \times 10^3$ Pa). It is also allowable to intentionally dope an n-type carrier by concomitant introduction of the n-type dopant during the layer growth. It is still also allowable to increase a ratio of the Group II element and Group VI element in the source materials (supplied II/VI ratio).

On the other hand, the growth of the active layer 4 and p-type MgZnO layer 5 proceeded under the oxygen-containing atmosphere at a pressure of $1 \times 10^3$ Pa or above is successful in more effectively suppressing the oxygen deficiency during the film growth, and in obtaining the active layer 4 or p-type MgZnO layer 5 having desirable characteristics. In this case, it is more preferable to adjust the oxygen partial pressure (any oxygen-containing molecules other than $O_2$ are defined to be also incorporated after being calculated on the $O_2$ basis) to $1 \times 10^3$ Pa or above. In the growth of the p-type MgZnO layer 5, the oxygen deficiency can further effectively be suppressed by intermittently interrupting the gas flow of the major source materials for the p-type MgZnO layer 5, to thereby promote oxidation.

After completion of the formation of the light emitting layer portion 10 as described in the above, the active layer 4 and p-type MgZnO layer 5 are partially removed by photolithography and so forth, and a transparent electrode 23 typically composed of ITO and so forth is formed, a metal electrode 22 is formed on the residual portion of the p-type MgZnO layer 5, and the product is diced together with the sapphire substrate 1 to thereby obtain a Zn-base semiconductor light emitting device 100. In this device, light extraction is available mainly from the transparent sapphire substrate 1 side.

Although the preceding paragraphs described one embodiment of this invention, it is to be understood that this invention is by no means limited thereto, and any modification and improvement can be added without departing from the technical scope based on the description in the claims. For example, the light emitting layer portion configured as a double heterostructure as shown in FIG. 1 may be replaced by a single heterostructure, and stacking in the order of n-type layer and p-type layer from the substrate side as shown in FIG. 1 may be replaced by the order of p-type layer and n-type layer from the substrate side.

Figure 3A:
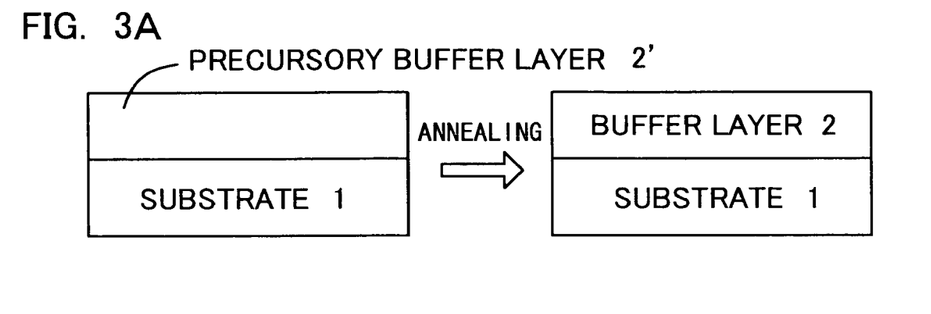
FIG. 3A is a schematic sectional view showing a process step of a first exemplary fabrication process of a buffer layer in the Zn-base semiconductor light emitting device of this invention.
Figure 3B:
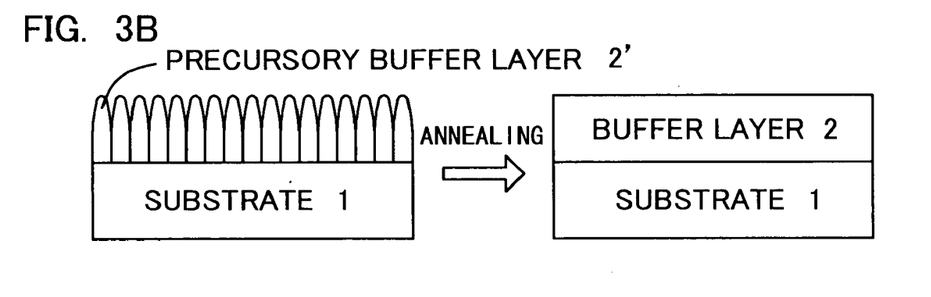
FIG. 3B is a schematic sectional view showing a process step of a second exemplary fabrication process of a buffer layer in the Zn-base semiconductor light emitting device of this invention.
Figure 3C:
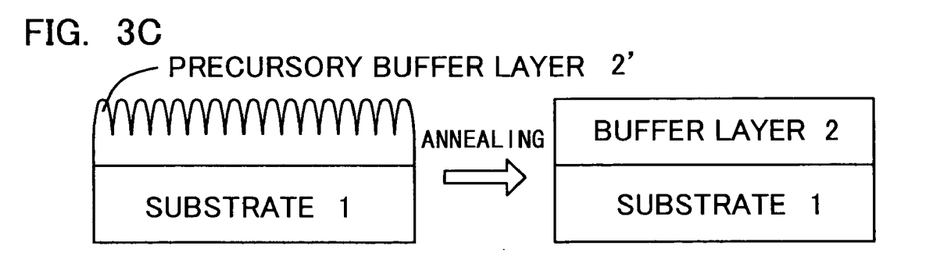
FIG. 3C is a schematic sectional view showing a process step of a third exemplary fabrication process of a buffer layer in the Zn-base semiconductor light emitting device of this invention.

An essential feature of this invention resides in the mode of formation of the buffer layer. The following paragraphs will therefore describe the fabrication process and mode of formation referring to several embodiments. FIGS. 3A to 3C are schematic sectional views showing process steps of fabrication of the buffer layer. As shown in FIGS. 3A to 3C, a precursory buffer layer 2' composed of the In-base compound or Zn-base compound is formed on the main surface of the substrate 1, and the precursory buffer layer 2' is then annealed to be crystallized into the buffer layer 2. Method of forming the precursory buffer layer and annealing conditions may be similar to those described in the above. FIG. 3A corresponds to the case where the precursory buffer layer 2' is formed as a polycrystal layer or an amorphous layer. For the case where the precursory buffer layer 2' is formed as a polycrystal layer, use of a single-crystal substrate such as sapphire substrate for the substrate 1 makes it possible to readily form the polycrystal layer having an orientation in the direction of principal axis of the single-crystal substrate, that is, in the thickness-wide direction. On the other hand, for the case where the precursory buffer layer 2' is formed as an amorphous layer, use of a single-crystal substrate such as sapphire substrate for the substrate 1 again makes it possible to more readily promote crystal orientation during the annealing for re-crystallization of the precursory buffer layer 2'.

FIG. 3B and 3C correspond to the cases where the substrate 1 is a single-crystal substrate and the precursory buffer layer 2' is a polycrystal layer. The precursory buffer layer 2' herein is formed so that columnar crystal grains spanned from the main surface of the substrate to the topmost surface of its own are densely arranged on the main surface of the substrate 1. This mode of dense arrangement of the columnar crystal grains oriented in the thickness-wise direction can be achieved by properly adjusting in order not to cover the whole region on the layer plane in a specific section in the thickness-wise direction during the formation process, for example, supply volume (e.g., gas flow rate in the vapor phase epitaxy process) of the major source materials of the constituent. Thus-composed precursory buffer layer 2' can yield the buffer layer 2 successfully reduced in dislocation and crystal defect. It is particularly preferable, as shown in FIGS. 3B and 3C, that the columnar crystal grains are formed so that the one and at least the adjacent one are formed while keeping a void therebetween on the topmost surface of the precursory buffer layer 2'. For the case where a sapphire substrate is used as the substrate 1 and a Zn-base compound such as ZnO is used as a compositional material for the precursory buffer layer 2', stacking of the precursory buffer layer 2' on "A" plane, or main surface, of the sapphire substrate also makes it possible to align the orientation axis of the individual columnar crystal grains in the same direction over the plane. Because the every adjacent columnar crystal grains are arranged while keeping a void therebetween, the crystal growth in the in-plane direction within the layer can, of course, be suppressed. This is successful in yielding the precursory buffer layer having dislocation and crystal defect effectively suppressed therein, and in more readily producing the buffer layer of high quality.

Figure 4A:
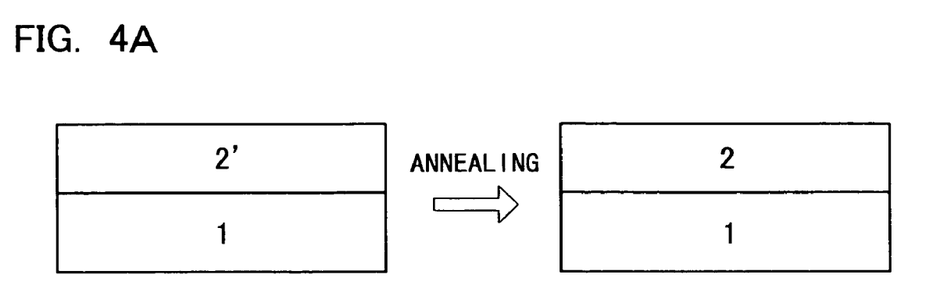
FIG. 4A is a schematic sectional view showing a process step of a fourth exemplary fabrication process of a buffer layer in the Zn-base semiconductor light emitting device of this invention.
Figure 4B:
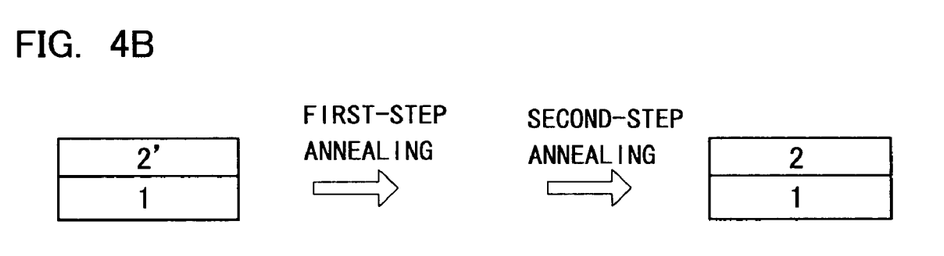
FIG. 4B is a schematic sectional view showing a process step of a fifth exemplary fabrication process of a buffer layer in the Zn-base semiconductor light emitting device of this invention.
Figure 4C:
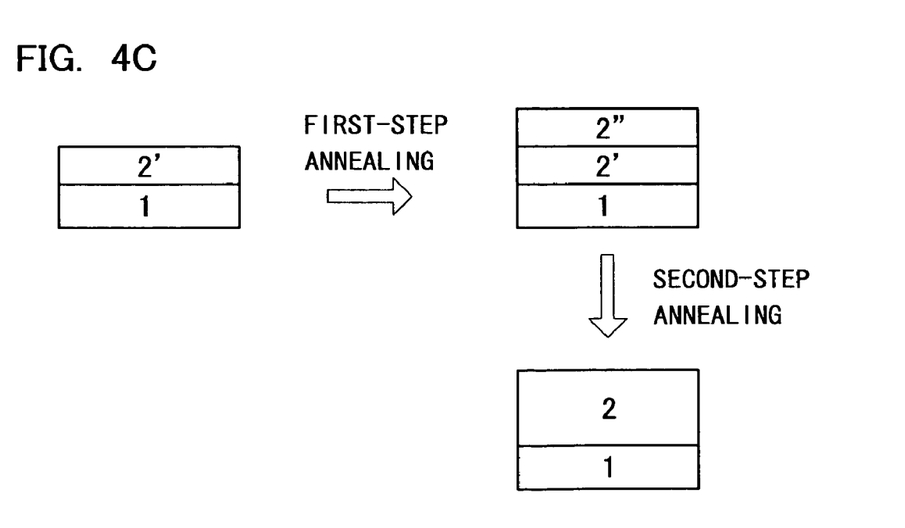
FIG. 4C is a schematic sectional view showing a process step of a sixth exemplary fabrication process of a buffer layer in the Zn-base semiconductor light emitting device of this invention.

The formation process of the buffer layer can also follow the method described in the next. The example is shown in FIGS. 4A to 4C. Again the buffer layers 2 shown in FIGS. 4A to 4C are obtained by forming the precursory buffer layer 2' on the main surface of the substrate 1, and by annealing the precursory buffer layer 2' for re-crystallization. It is to be noted that the formation temperature of the precursory buffer layer 2' in FIGS. 4A to 4C is set lower at least than the formation temperature of the light emitting layer portion which serves as the light emitting region. The formation temperature of the light emitting layer portion is typically adjusted to a range from approximately 300 to 1,000° C. as described in the above. This temperature range is set in consideration of the compositional materials, in order to make the crystal state of the light emitting layer portion closer to single crystal (including single crystal). The formation of the precursory buffer layer 2' at a temperature lower at least than the formation temperature of the light emitting layer portion is therefore successful in obtaining the precursory buffer layer 2' in a form of an amorphous layer, or a polycrystal layer, or a layer containing these two phases, having the degree of orientation lower than that of a single crystal layer. In FIG. 4A, the precursory buffer layer 2' is annealed at an annealing temperature set higher than the formation temperature of the light emitting layer portion, and is successfully converted into the high-quality buffer layer 2. In FIG. 4B, the precursory buffer layer 2' is subjected to a first-step annealing at a first annealing temperature set between the formation temperature of the light emitting layer portion and the formation temperature of the precursory buffer layer 2', and by further subjecting it to a second-step annealing at a second annealing temperature set higher than the formation temperature of the light emitting layer portion, to thereby obtain the high-quality buffer layer 2. Further in FIG. 4C, a second layer portion 2'' having a compositional material having the same composition with the precursory buffer layer 2' is formed by stacking on the precursory buffer layer 2' while assuming it as a first layer portion 2', between the first-stage annealing and second-stage annealing shown in FIG. 4B. The formation temperature of the second layer portion 2'' is again set lower than the formation temperature of the light emitting layer portion. Thus-composed buffer layer 2 shown in FIG. 4C comprises the first layer portion 2' and second layer portion 2'', and can gain a higher quality than that of the buffer layer 2 shown in FIG. 4B. As shown in FIGS. 4A to 4C, quality of the buffer layer can readily be improved also by specifying the relation of highness of the formation temperature of the precursory buffer layer, annealing temperature for the precursory buffer layer and the formation temperature of the light emitting layer portion.

What is claimed is:

1. A method of fabricating a Zn-base semiconductor light emitting device comprising the steps of:
    forming, on a main surface of a substrate, a buffer layer composed of an In-base compound or a Zn-base compound not contained in the substrate; and
    forming, on the buffer layer, a light emitting region composed of a Zn-base compound, wherein
    the buffer layer is obtained by forming a stack as a polycrystal layer or an amorphous layer on the main surface of the substrate, and by annealing the stack before the light emitting region is formed;
    and wherein the substrate is a single-crystal substrate, and the stack is formed as a polycrystal layer composed of crystal grains oriented in the direction of the principal axis of the single-crystal substrate.

2. The method of fabricating a Zn-base semiconductor light emitting device as claimed in claim 1, wherein the substrate is a sapphire substrate.

3. The method of fabricating a Zn-base semiconductor light emitting device as claimed in claim 1, wherein the substrate is a glass substrate.

4. The method of fabricating a Zn-base semiconductor light emitting device as claimed in claim 1, wherein the buffer layer is composed of indium tin oxide or zinc oxide.

5. The method of fabricating a Zn-base semiconductor light emitting device as claimed in claim 1, wherein an annealing atmosphere in the annealing is an oxygen-containing atmosphere.

6. The method of fabricating a Zn-base semiconductor light emitting device as claimed in claim 1, wherein the buffer layer is formed to a thickness of 1 µm or below.

7. The method of fabricating a Zn-base semiconductor light emitting device as claimed in claim 1 wherein the substrate is a sapphire substrate.

8. The method of fabricating a Zn-base semiconductor light emitting device as claimed in claim 1, wherein the stack is formed so that columnar crystal grains spanned from the main surface of the substrate to the topmost surface of the stack are densely arranged on the main surface of the substrate.

9. The method of fabricating a Zn-base semiconductor light emitting device as claimed in claim 8, wherein the columnar crystal grains are formed at a topmost surface of the stack so that the one and at least the adjacent one are formed while keeping a void therebetween.

10. The method of fabricating a Zn-base semiconductor light emitting device as claimed in claim 1, wherein the temperature for the annealing is set higher than the formation temperature of the stack.

11. The method of fabricating a Zn-base semiconductor light emitting device as claimed in claim 10, wherein the formation temperature of the stack is set to 400° C. or below.

12. The method of fabricating a Zn-base semiconductor light emitting device comprising the steps of:
    forming, on a main surface of a substrate, a buffer layer composed of an In-base compound or a Zn-base compound not contained in the substrate; and
    forming, on the buffer layer, a light emitting region composed of a Zn-base compound, wherein
    the buffer layer is obtained by forming a stack as a polycrystal layer or an amorphous layer on the main surface of the substrate, and by annealing the stack before the light emitting region is formed, and
    wherein the substrate is a single-crystal substrate, the stack is formed as an amorphous layer, and the stack is annealed to convert itself into the polycrystal buffer layer.

13. The method of fabricating a Zn-base semiconductor light emitting device as claimed in claim 12 wherein the substrate is a sapphire substrate.

14. A method of fabricating a Zn-base semiconductor light emitting device comprising the steps of:
    forming, on a main surface of a substrate, a buffer layer composed of an indium tin oxide; and
    forming, on the buffer layer, a light emitting region composed of a Zn-base compound, wherein
    the buffer layer is obtained by forming a stack composed of the indium tin oxide at a temperature lower than the formation temperature of the light emitting region, and by annealing, before the light emitting region is formed, the stack at a temperature higher than the formation temperature of the light emitting region.

15. The method of fabricating a Zn-base semiconductor light emitting device as claimed in claim 14, wherein the formation temperature of the light emitting region is set within a range from 300 to 1,000° C., both ends inclusive.

16. The method of fabricating a Zn-base semiconductor light emitting device as claimed in claim 14, wherein the formation temperature of the stack is set to 400° C. or below.

17. The method of fabricating a Zn-base semiconductor light emitting device as claimed in claim 14, wherein an annealing atmosphere in the annealing is an oxygen-containing atmosphere.

18. The method of fabricating a Zn-base semiconductor light emitting device as claimed in claim 14, wherein the buffer layer is formed to a thickness of 1 µm or below.

19. A method of fabricating a Zn-base semiconductor light emitting device comprising the steps of:
    forming, on a main surface of a substrate, a buffer layer composed of an In-base compound or a Zn-base compound not contained in the substrate; and
    forming, on the buffer layer, a light emitting region composed of a Zn-base compound, wherein the buffer layer is obtained by forming a stack composed of the In-base compound or the Zn-base compound at a temperature lower than the formation temperature of the light emitting region, by annealing before the light emitting region is formed, the stack at a first annealing temperature set between the formation temperature of the light emitting region and the formation temperature of the stack, and by further annealing, the stack at a second annealing temperature set higher than the formation temperature of the light emitting region.

20. The method of fabricating a Zn-base semiconductor light emitting device as claimed in claim 19, wherein the buffer layer is composed of indium tin oxide or zinc oxide.

21. The method of fabricating a Zn-base semiconductor light emitting device as claimed in claim 19, wherein the formation temperature of the stack is set to 400° C. or below.

22. The method of fabricating a Zn-base semiconductor light emitting device as claimed in claim 19, wherein the formation temperature of the light emitting region is set within a range from 300 to 1,000° C., both ends inclusive.

23. The method of fabricating a Zn-base semiconductor light emitting device as claimed in claim 19, wherein an annealing atmosphere in the annealing is an oxygen-containing atmosphere.

24. The method of fabricating a Zn-base semiconductor light emitting device as claimed in claim 19, wherein the buffer layer is formed to a thickness of 1 µm or below.

25. The method of fabricating a Zn-base semiconductor light emitting device as claimed in claim 19, wherein the buffer layer is formed by annealing the stack, which corresponds to a first layer portion of the buffer layer, at the first annealing temperature, by stacking the In-base compound or the Zn-base compound on the stack to thereby form a second layer portion of the buffer layer, and by annealing at the second annealing temperature.

26. The method of fabricating a Zn-base semiconductor light emitting device as claimed in claim 25, wherein the buffer layer is composed of indium tin oxide or zinc oxide.

* * * * *